United States Patent
Zheng

(10) Patent No.: US 12,283,575 B2
(45) Date of Patent: Apr. 22, 2025

(54) DISPLAY SCREEN SPLICING METHOD AND SPLICED DISPLAY SCREEN

(71) Applicants: HUIZHOU CHINA STAR OPTOELECTRONICS DISPLAY CO., LTD, Guangdong (CN); TCL CHINA STAR OPTOELECTRONICS TECHNOLOGY CO., LTD., Guangdong (CN)

(72) Inventor: Zeke Zheng, Guangdong (CN)

(73) Assignees: HUIZHOU CHINA STAR OPTOELECTRONICS DISPLAY CO., LTD, Guangdong (CN); TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/623,361

(22) PCT Filed: Dec. 13, 2021

(86) PCT No.: PCT/CN2021/137452
§ 371 (c)(1),
(2) Date: Dec. 28, 2021

(87) PCT Pub. No.: WO2023/102953
PCT Pub. Date: Jun. 15, 2023

(65) Prior Publication Data
US 2024/0072011 A1    Feb. 29, 2024

(30) Foreign Application Priority Data
Dec. 7, 2021 (CN) .......................... 202111484591.0

(51) Int. Cl.
*H01L 25/075* (2006.01)
*G09F 9/302* (2006.01)
(Continued)

(52) U.S. Cl.
CPC .......... *H01L 25/0753* (2013.01); *H01L 33/62* (2013.01); *H01L 2933/0066* (2013.01)

(58) Field of Classification Search
CPC ................ H01L 25/0753; H01L 33/62; H01L 2933/0066; G09F 9/33; G09F 9/3026; G09F 9/302; G09G 2300/0426; G09G 2300/0861
See application file for complete search history.

(56) References Cited

U.S. PATENT DOCUMENTS

2004/0207315 A1   10/2004   Robbie et al.
2021/0366378 A1   11/2021   Zhao et al.

FOREIGN PATENT DOCUMENTS

CN   111276474 A   6/2020
CN   111383554 A   7/2020
(Continued)

OTHER PUBLICATIONS

International Search Report in International application No. PCT/CN2021/137452, mailed on Sep. 6, 2022.
(Continued)

*Primary Examiner* — Sonya McCall-Shepard
(74) *Attorney, Agent, or Firm* — PV IP PC; Wei Te Chung

(57) ABSTRACT

A display screen splicing method and a spliced display screen are provided. According to the display screen splicing method provided in the embodiments of the present disclosure, a first to-be-spliced panel is connected to a second to-be-spliced panel in a splicing area using conductive connecting portions. In addition, the conductive connecting portions are manufactured by inkjet printing to perform connection between the two adjacent to-be-spliced panels by using signals, so as to realize narrow-seam splicing. By means of the display screen splicing method provided in the embodiments of the present disclosure, the process is sim- (Continued)

plified, and the precision requirements for devices are reduced.

19 Claims, 5 Drawing Sheets

(51) Int. Cl.
*G09F 9/33* (2006.01)
*H01L 33/62* (2010.01)

(56) References Cited

FOREIGN PATENT DOCUMENTS

| | | |
|---|---|---|
| CN | 211016323 U | 7/2020 |
| CN | 111768716 A | 10/2020 |
| CN | 111798756 A | 10/2020 |
| CN | 112748612 A | 5/2021 |
| CN | 112863390 A | 5/2021 |
| CN | 113383382 A | 9/2021 |
| CN | 113540170 A | 10/2021 |
| CN | 113643613 A | 11/2021 |
| KR | 20210128752 A | 10/2021 |

OTHER PUBLICATIONS

Written Opinion of the International Search Authority in International application No. PCT/CN2021/137452, mailed on Sep. 6, 2022.
Chinese Office Action issued in corresponding Chinese Patent Application No. 202111484591.0 dated Mar. 22, 2023, pp. 1-10.

DISPLAY SCREEN SPLICING METHOD AND SPLICED DISPLAY SCREEN

CROSS-REFERENCE TO RELATED APPLICATIONS

This application is a 371 U.S. National Phase of International Application No. PCT/CN2021/137452, filed Dec. 13, 2021, which claims priority to Chinese Patent Application No. 202111484591.0, filed Dec. 7, 2021. The entire disclosures of the above applications are incorporated herein by reference.

FIELD OF INVENTION

The present disclosure relates to the field of display technologies, and in particular, to a display screen splicing method and a spliced display screen.

BACKGROUND OF INVENTION

The market has an increasing demand for narrow-seam and large-size spliced mini-light-emitting diodes (mini-LED) or micro-light-emitting diodes (micro-LED). In order to reduce seams, currently, side binding or back binding are usually performed. During research and practice of the prior art, the inventor of the present disclosure found that, side binding or back binding is currently relatively difficult to perform, a side wire process is required, and the precision requirements for devices are high.

SUMMARY OF INVENTION

Technical Problem

Embodiments of the present disclosure provide a display screen splicing method and a spliced display screen, which can simply the process and reduce the requirements for devices.

Technical Solution

Embodiments of the present disclosure provide a display screen splicing method. The method includes:
providing a first to-be-spliced panel and a second to-be-spliced panel, wherein first pads are disposed on the first to-be-spliced panel, and second pads are disposed on the second to-be-spliced panel;
aligning the first pads to the second pads to form a plurality of pad combinations, wherein a plurality of first pads are manufactured on a side of the first to-be-spliced panel close to the second to-be-spliced panel, and a plurality of second pads are manufactured on a side of the second to-be-spliced panel close to the first to-be-spliced panel; and
manufacturing conductive connecting portions on the pad combinations, wherein the conductive connecting portions connect the first pads to the second pads in the pad combinations.

Optionally, in some embodiments of the present disclosure, the manufacturing conductive connecting portions on the pad combinations includes:
performing inkjet printing on the pad combinations with conductive droplets, wherein the conductive droplets connect the first pads to the second pads in the pad combinations; and
curing the conductive droplets to form the conductive connecting portions.

Optionally, in some embodiments of the present disclosure, the curing includes thermocuring or photocuring, and a duration of the curing is between 20 minutes and 40 minutes.

Optionally, in some embodiments of the present disclosure, a temperature of the thermocuring is between 80° C. and 150° C.

Optionally, in some embodiments of the present disclosure, the first to-be-spliced panel and the second to-be-spliced panel each have a display area and a splicing area disposed adjacent to each other. The first pads are disposed in the splicing area of the first to-be-spliced panel. The second pads are disposed in the splicing area of the second to-be-spliced panel.

Optionally, in some embodiments of the present disclosure, after one of the conductive connecting portions is manufactured on each of the first pads and the corresponding second pad, the method further includes:
manufacturing a protective layer on the conductive connecting portions, wherein the protective layer completely covers the conductive connecting portions, the first pads, and the second pads.

Optionally, in some embodiments of the present disclosure, the manufacturing a protective layer on the conductive connecting portions includes:
performing inkjet printing on the conductive connecting portions with a protective layer material, to cause the protective layer to cover the conductive connecting portions, the first pads, and the second pads; and
curing the protective layer material to form the protective layer.

Optionally, in some embodiments of the present disclosure, a width of the protective layer is between 30 microns and 80 microns, and a thickness of the protective layer is between 4 microns and 8 microns.

Optionally, in some embodiments of the present disclosure, a spacing between each first pad and each second pad is less than 100 microns.

Optionally, in some embodiments of the present disclosure, a width of each first pad is between 10 microns and 50 microns, and a width of each second pad is between 10 microns and 50 microns.

Correspondingly, the embodiments of the present disclosure further provide a spliced display screen. The spliced display screen includes a first to-be-spliced panel and a second to-be-spliced panel. A plurality of first pads are disposed on a side of the first to-be-spliced panel close to the second to-be-spliced panel. A plurality of second pads are disposed on a side of the second to-be-spliced panel close to the first to-be-spliced panel. A conductive connecting portion is correspondingly disposed on each first pad and each second pad. The first pads are connected to the second pads in a one-to-one correspondence using the conductive connecting portions.

Optionally, in some embodiments of the present disclosure, the spliced display screen further includes a protective layer. The protective layer is disposed on the conductive connecting portions. The protective layer completely covers the conductive connecting portions, the first pads, and the second pads.

Optionally, in some embodiments of the present disclosure, a width of the protective layer is between 30 microns and 80 microns, and a thickness of the protective layer is between 4 microns and 8 microns.

Optionally, in some embodiments of the present disclosure, the protective layer comprises black ink, silicon resin doped with a carbon material, or epoxy resin doped with the carbon material.

Optionally, in some embodiments of the present disclosure, the first to-be-spliced panel and the second to-be-spliced panel each have a display area and a splicing area disposed adjacent to each other. The first pads are connected to the second pads in a one-to-one correspondence using the conductive connecting portions. The first pads are disposed in the splicing area of the first to-be-spliced panel. The second pads are disposed in the splicing area of the second to-be-spliced panel.

Optionally, in some embodiments of the present disclosure, a chip on film (COF) is bound to the first to-be-spliced panel and/or the second to-be-spliced panel. The COF is disposed on a side of the first to-be-spliced panel away from the second to-be-spliced panel, and/or the COF is disposed on a side of the second to-be-spliced panel away from the first to-be-spliced panel.

Optionally, in some embodiments of the present disclosure, a spacing between each first pad and each second pad is less than 100 microns.

Optionally, in some embodiments of the present disclosure, each conductive connecting portion comprises one of silver, aluminum, nickel, chromium, molybdenum, copper, tungsten, or titanium.

Optionally, in some embodiments of the present disclosure, a thickness of the conductive connecting portion is between 2 microns and 6 microns.

Optionally, in some embodiments of the present disclosure, a width of the first pad is between 10 microns and 50 microns, and a width of the second pad is between 10 microns and 50 microns.

Beneficial Effects

Embodiments of the present disclosure provide a display screen splicing method and a spliced display screen. According to the display screen splicing method provided in the embodiments of the present disclosure, the first to-be-spliced panel is connected to the second to-be-spliced panel in the splicing area by using the conductive connecting portions. Therefore, the process can be simplified, and the requirements for devices can be reduced. In addition, the conductive connecting portions are manufactured by inkjet printing to perform connection between the two adjacent to-be-spliced panels by using signals, so as to realize narrow-seam splicing. Since the manufacturing of side or back traces is not required, and only the conductive connecting portions are manufactured by using an inkjet printing device, the process is simplified, and the precision requirements for devices are reduced.

BRIEF DESCRIPTION OF DRAWINGS

To describe technical solutions in embodiments of the present disclosure more clearly, the following briefly introduces the accompanying drawings required for describing the embodiments. Apparently, the accompanying drawings in the following description show only some embodiments of the present disclosure, and a person skilled in the art may still derive other accompanying drawings from these accompanying drawings without creative efforts.

DETAILED DESCRIPTION OF PREFERRED EMBODIMENTS

Figure 1:
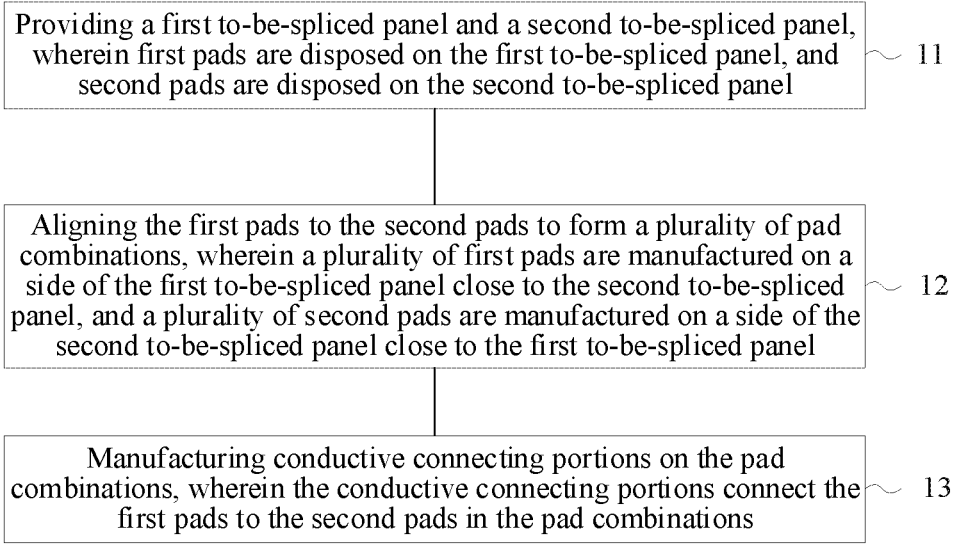
FIG. 1 is a first schematic flowchart of a display screen splicing method according to an embodiment of the present disclosure.

The technical solutions in the embodiments of the present disclosure are clearly and completely described in the following with reference to the accompanying drawings in the embodiments of the present disclosure. Apparently, the embodiments to be described are merely some embodiments of the present disclosure rather than all of the embodiments. All other embodiments obtained by a person skilled in the art based on the embodiments of the present disclosure without creative efforts shall fall within the protection scope of the present disclosure. All other embodiments obtained by a person skilled in the art based on the embodiments of the present disclosure without creative efforts shall fall within the protection scope of the present disclosure. In the present disclosure, without the contrary explanation, the directional terms such as "upper" and "lower" are usually used to refer to the top and bottom of the device in actual use or operating condition, specifically refer to the orientation of the drawing in the accompanying drawings; and "inside" and "outside" refer to the inside and outside of the contour of the corresponding component.

Embodiments of the present disclosure provide a display screen splicing method and a spliced display screen. Detailed descriptions are separately provided below. The description sequence of the following embodiments is not intended to limit preference orders of the embodiments.

Referring to FIG. 1, FIG. 1 is a first schematic flowchart of a display screen splicing method according to an embodiment of the present disclosure. The display screen splicing method provided in the present embodiment of the present disclosure includes steps as follows:

11: Providing a first to-be-spliced panel and a second to-be-spliced panel, wherein first pads are disposed on the first to-be-spliced panel, and second pads are disposed on the second to-be-spliced panel.

In detail, glass substrates may be used as substrates of the first to-be-spliced panel and the second to-be-spliced panel. The glass substrates are first attached and spliced.

12: Aligning the first pads to the second pads to form a plurality of pad combinations, wherein a plurality of first pads are manufactured on a side of the first to-be-spliced panel close to the second to-be-spliced panel, and a plurality of second pads are manufactured on a side of the second to-be-spliced panel close to the first to-be-spliced panel.

During splicing of the first to-be-spliced panel and the second to-be-spliced panel, the first pads and the second pads are required to be accurately aligned to guarantee the accuracy of transmitted signals.

According to different product requirements, pads configured to be connected to a transverse signal and a longitudinal signal may be disposed on the first to-be-spliced panel and the second to-be-spliced panel, and may be corresponding aligned and connected. For example, when four to-be-spliced panels are required to be spliced in a 2×2 form, the first pads may be manufactured on two adjacent intersecting sides of the first to-be-spliced panel for splicing, for alignment and splicing with the second to-be-spliced panel, and so is the second to-be-spliced panel. In this way, a larger display panel can be spliced.

It is to be noted that, in the embodiments of the present disclosure, a display side of the panel is normally bound, that is to say, a front border area is bound. A spacing between each first pad and each second pad can be reduced to be less 100 microns by means of an edge grinding process. Therefore, the seam width is not affected. In detail, the spacing between the first pad and the second pad may be 100 microns, 90 microns, 80 microns, 70 microns, 60 microns, 50 microns, 40 microns, 30 microns, 20 microns, 10 microns, or 5 microns. The edge grinding process is a process commonly used by those skilled in the art, and details are not described herein.

The first pads are manufactured on a side of the first to-be-spliced panel close to the second to-be-spliced panel. The second pads are manufactured on a side of the second to-be-spliced panel close to the first to-be-spliced panel. The first pads and the second pads are configured to transmit electric signals on the panels, for example, a voltage signal, a scanning signal, and a data signal.

Optionally, the first to-be-spliced panel and the second to-be-spliced panel each have a display area and a splicing area disposed adjacent to each other. The first pads are correspondingly connected to the second pads in a one-to-one correspondence using the conductive connecting portions. The first pads are disposed in the splicing area of the first to-be-spliced panel. The second pads are disposed in the splicing area of the second to-be-spliced panel. That is to say, the first pads are disposed on a display side of the first to-be-spliced panel, and the second pads are disposed on a display side of the second to-be-spliced panel. In this way, traces required for side binding and back binding can be saved, so that disposing traces on side surfaces and back sides of the to-be-spliced panels can be saved. Therefore, the manufacturing process is simplified, and the process precision is reduced. It may be understood that, the first pads may alternatively be disposed on a non-display side of the first to-be-spliced panel. The first pads are bound to the back side across the first to-be-spliced panel through a via. In addition, the second pads may alternatively be disposed on a non-display side of the second to-be-spliced panel, and are bound to the back side through a via.

It is to be noted that, the display sides in the embodiments of the present disclosure mean surfaces of the first to-be-spliced panel and the second to-be-spliced panel for displaying. The first pads and the second pads are disposed in a border area, and therefore do not affect the displaying of the to-be-spliced panel.

13: Manufacturing conductive connecting portions on the pad combinations, wherein the conductive connecting portions connect the first pads to the second pads in the pad combinations.

Optionally, each conductive connecting portion may be made of any of silver (Ag), aluminum (Al), nickel (Ni), chromium (Cr), molybdenum (Mo), copper (Cu), tungsten (W), or titanium (Ti). Metals, such as silver, aluminum, and copper have desirable conductivity and low costs. Therefore, not only the production cost can be reduced, but also the conductivity of the conductive connecting portion is guaranteed. In detail, description is provided below using an example that the conductive connecting portion is made of silver. A conductive silver paste is spread, and the corresponding first pads and second pads on two sides of a seam are connected using a silver wire, to realize connection. Optionally, the transverse signal and the longitudinal signal may be connected and transmitted using the silver line.

A thickness of the conductive connecting portion is between 2 microns and 6 microns, and a width of the conductive connecting portion is between 10 microns and 50 microns. In detail, the thickness of the conductive connecting portion may be 2 microns, 3 microns, 4 microns, 5 microns, or 6 microns. The width of the conductive connecting portion may be 10 microns, 15 microns, 20 microns, 25 microns, 30 microns, 35 microns, 40 microns, 45 microns, or 50 microns.

It may be understood that, a width of each of the first pads or each of the second pads is usually between 10 microns and 50 microns. In detail, the width of the first pad or the second pad may be 10 microns, 15 microns, 20 microns, 25 microns, 30 microns, 35 microns, 40 microns, 45 microns, or 50 microns.

Therefore, the width of the conductive connecting portion may be designed corresponding to the width of the pad. In addition, the conductive connecting portion is manufactured to have a certain thickness, to ensure more desirable conductivity of the conductive connecting portion. It is to be noted that, the width of the conductive connecting portion may be greater than the widths of the first pad and the second pad, as long as the adjacent conductive connecting portions are avoided from a short circuit. Therefore, by reducing the on-resistance of the conductive connecting portion, signals of the first to-be-spliced panel and the second to-be-spliced panel can be transmitted more effectively.

In detail, the manufacturing conductive connecting portions on the pad combinations includes the following steps:

131: Performing inkjet printing on the pad combinations with conductive droplets, wherein the conductive droplets connect the first pads to the second pads in the pad combinations.

Optionally, the first pads may be correspondingly connected to the second pads by using the conductive connecting portions by inkjet printing. The example that the conductive connecting portion is made of silver is still used for description. A nano-silver ink droplet is continuously sprayed onto a substrate by using a thin nozzle to form a continuous silver line. By means of the thin nozzle for inkjet printing, a width of the silver line may be controlled to be 10 microns or less. Since the width of the silver line is controllable, overflow is avoided, and a short circuit is avoided between the adjacent conductive connecting portions.

132: Curing the conductive droplets to form the conductive connecting portions.

Optionally, the curing includes thermocuring and photocuring, and a duration of the curing is between 20 minutes and 40 minutes. In detail, the duration of the curing may be 20 minutes, 25 minutes, 30 minutes, 35 minutes, or 40 minutes. If the duration of the curing is excessively short, incomplete curing of the conductive connecting portions is easily caused. If the conductive connecting portions are not completely cured, the conductive droplets may flow, resulting in a short circuit between the conductive connecting portions. However, if the duration of the curing is excessively long, other circuit elements on the first to-be-spliced panel or the second to-be-spliced panel may be affected. As a result, the operation of the panel is affected, and the displaying is affected.

It is to be noted that, curing the conductive droplets is intended to remove solvents in the conductive droplets to form solid metal conductive portions.

In detail, the example in the above step that the conductive connecting portions is made of silver is used for further description. After the silver line is printed, the silver line is cured with an ultraviolet (UV) lamp for 30 minutes, to further resolve the overflow.

Optionally, a temperature of the thermocuring is between 80° C. and 150° C. In detail, the temperature of the thermocuring may be 80° C., 85° C., 90° C., 95° C., 100° C., 105° C., 110° C., 115° C., 120° C., 125° C., 130° C., 135° C., 140° C., 145° C., or 150° C. The above values are merely examples, and other values between 80° C. and 150° C. may also be used for the thermocuring of the conductive connecting portions. It is to be noted that, the reason why the embodiments of the present disclosure exemplify the thermocuring temperature range of 80° C. to 150° C. is that an excessively low temperature may cause incomplete curing and an excessively high temperature may affect the operation performance of other circuit elements in the first to-be-spliced panel and the second to-be-spliced panel. The temperature range provided in the embodiments of the present disclosure is a more preferable curing temperature, but is not used as limitation on the present disclosure.

It may be understood that, the curing temperature and the curing duration may be adjusted according to requirements. For example, when the curing temperature is relatively high, the curing duration may be properly shortened, so as to cure the conductive connecting portions within a shortest time. Similarly, when the curing temperature is relatively low, the curing time may be prolonged, so that the impact of the curing treatment on other elements of the panel is minimized, and the curing effect can also be guaranteed.

According to the display screen splicing method provided in the embodiments of the present disclosure, the first to-be-spliced panel is connected to the second to-be-spliced panel in the splicing area by using the conductive connecting portions. The conductive connecting portions are manufactured by inkjet printing to perform connection between the two adjacent to-be-spliced panels by using signals, so as to realize narrow-seam splicing. Since the manufacturing of side or back traces is not required, and only the conductive connecting portions are manufactured by using an inkjet printing device, the process is simplified, and the precision requirements for devices are reduced.

Figure 2:
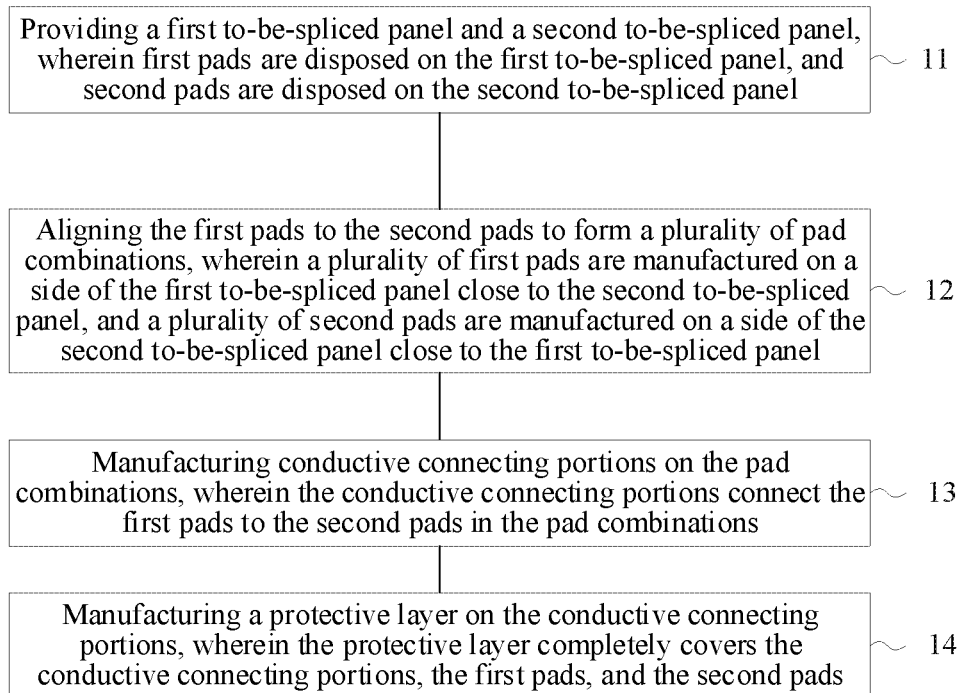
FIG. 2 is a second schematic flowchart of the display screen splicing method according to an embodiment of the present disclosure.
Figure 3A:
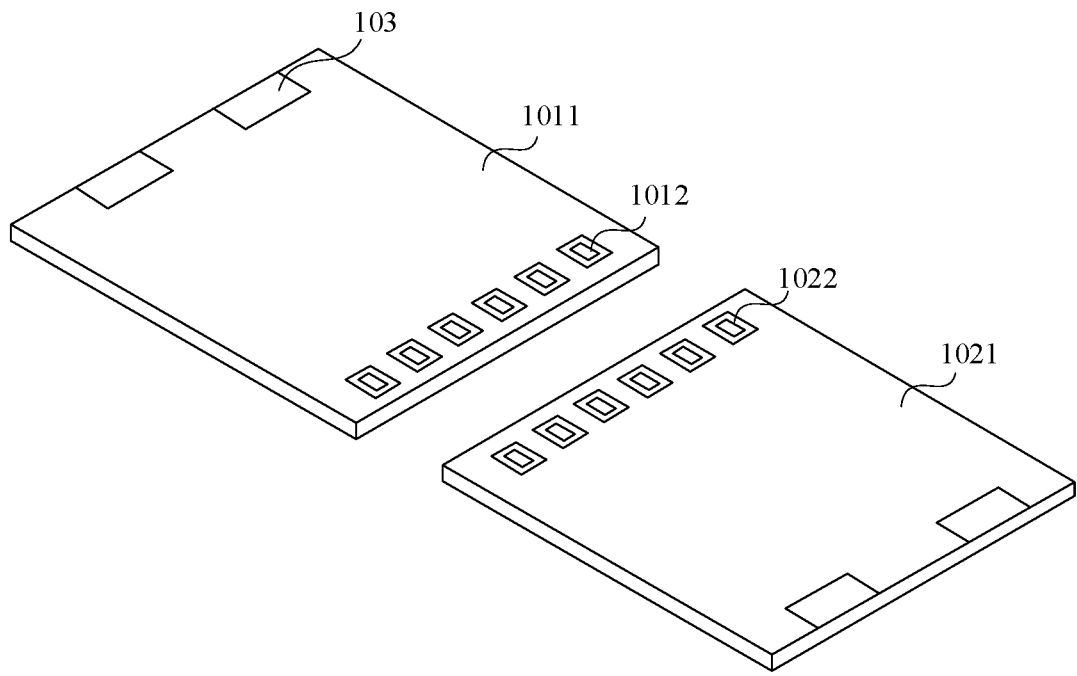
FIGS. 3a to 3d are schematic diagrams of steps of the display screen splicing method according to an embodiment of the present disclosure.
Figure 3B:
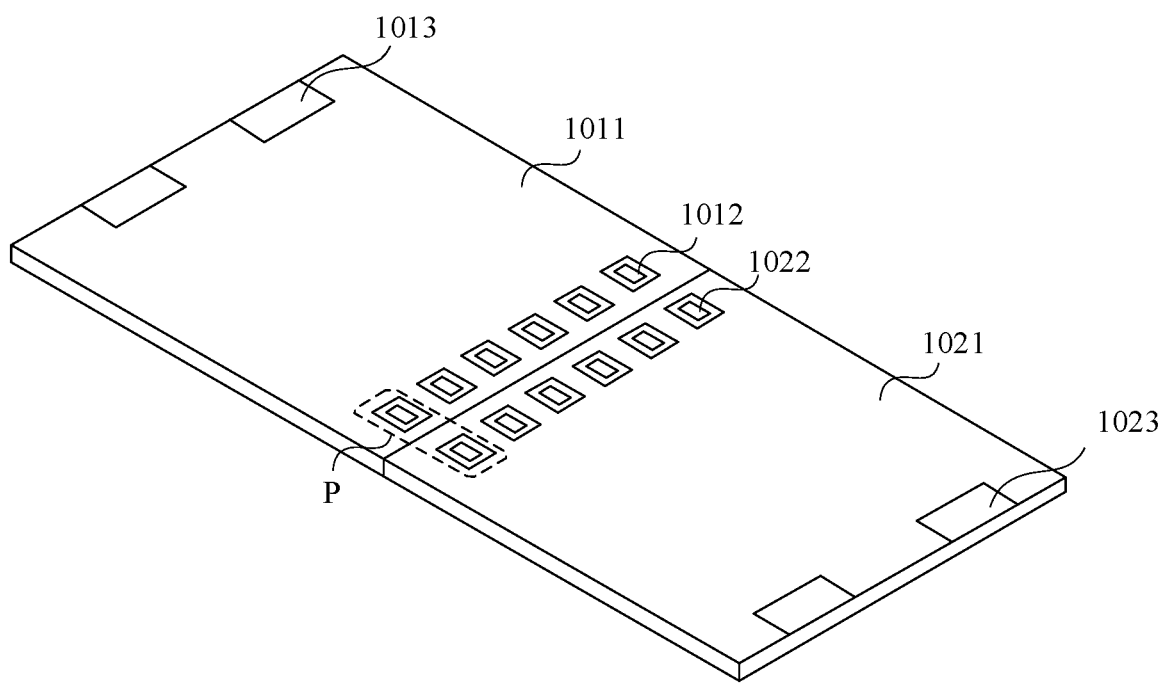
Figure 3C:
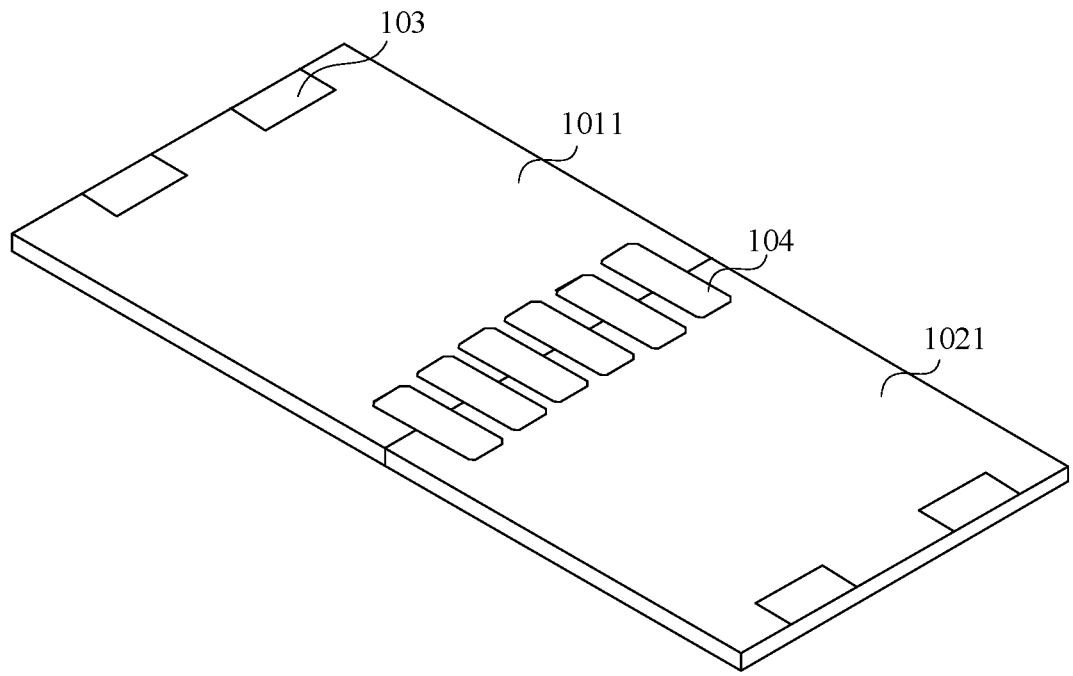
Figure 3D:
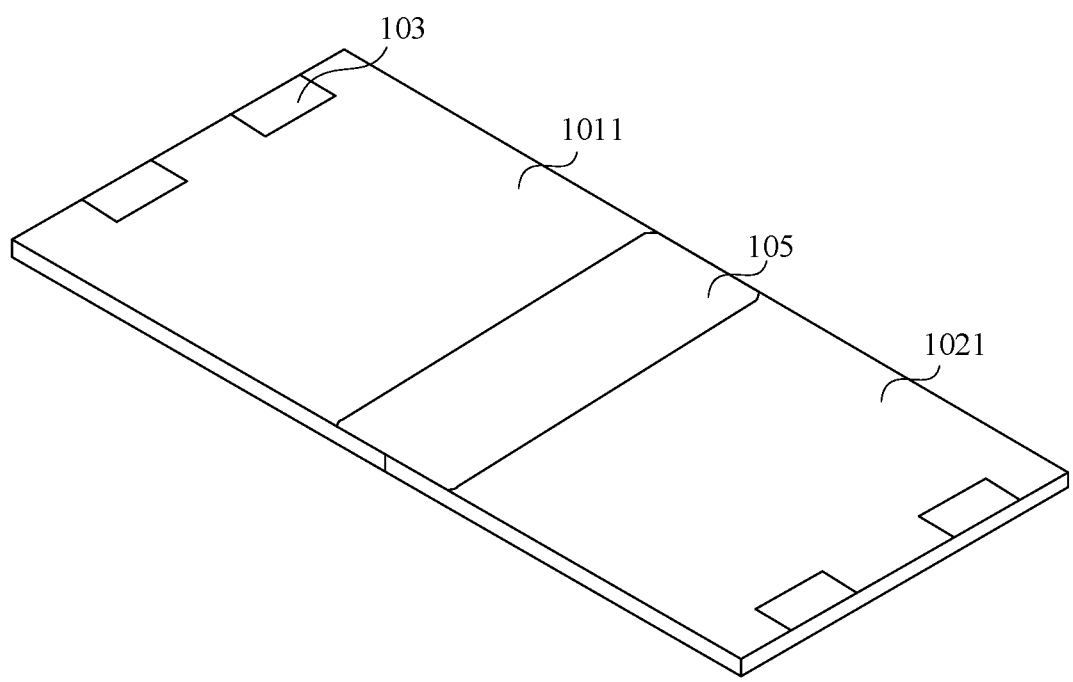

Optionally, referring to FIGS. 2 to 3d, FIG. 2 is a second schematic flowchart of the display screen splicing method according to an embodiment of the present disclosure, and FIGS. 3a to 3d are schematic diagrams of steps of the display screen splicing method according to an embodiment of the present disclosure. A difference between the embodiment shown in FIG. 2 and the embodiment shown in FIG. 1 lies in that the display screen splicing method includes steps as follows:

11: Providing a first to-be-spliced panel 1011 and a second to-be-spliced panel 1021, wherein first pads 1012 are disposed on the first to-be-spliced panel 1011, and second pads 1022 are disposed on the second to-be-spliced panel 1021.

In detail, referring to FIG. 3a, FIG. 3a shows the first to-be-spliced panel 1011 and the second to-be-spliced panel 1021 according to an embodiment of the present disclosure. It may be understood that, other devices disposed on the first to-be-spliced panel 1011 and the second to-be-spliced panel 1021 are not shown in the figures. Structures of other devices are technical means well known to those skilled in the art, and details are not described herein.

A chip on film (COF) is further bound to the first to-be-spliced panel 1011 and the second to-be-spliced panel 1021 in FIG. 3a. The COF is bound to a side of the first to-be-spliced panel 1011 away from the second to-be-spliced panel 1021. The COF is bound to a side of the second to-be-spliced panel 1021 away from the first to-be-spliced panel 1011. The COF is formed by bonding and mounting chips (for example, a source drive IC or a gate drive IC) to a flexible wiring substrate having a wiring pattern formed thereon. The wiring pattern of the COF is usually formed by an inner lead connected to an electrode of the chip and an outer lead connected to an external circuit.

FIG. 3a is a schematic diagram of splicing two to-be-spliced panels. When more than two to-be-spliced panels are spliced, the COF is bound to at least an outermost to-be-spliced panel in each row. For example, when the to-be-spliced panels are to be spliced in a 2×2 form, the first pads may be manufactured on two adjacent intersecting sides of the first to-be-spliced panel 1011 for splicing, for alignment and splicing with the second to-be-spliced panel 1021, and so is the second to-be-spliced panel 1021. In this case, the COF is bound to a first to-be-spliced panel 1011 and a second to-be-spliced panel 1021 located outside.

12: Aligning the first pads 1012 to the second pads 1022 to form pad combinations P, wherein a plurality of first pads 1012 are manufactured on a side of the first to-be-spliced panel 1011 close to the second to-be-spliced panel 1021, and a plurality of second pads 1022 are manufactured on a side of the second to-be-spliced panel 1021 close to the first to-be-spliced panel 1011.

Optionally, the first to-be-spliced panel 1011 and the second to-be-spliced panel 1021 each have a display area and a splicing area disposed adjacent to each other. The first pads 1012 are disposed in the splicing area of the first to-be-spliced panel 1011. The second pads 1022 are disposed in the splicing area of the second to-be-spliced panel 1021.

Referring to FIG. 3b, FIG. 3b is a schematic diagram of the first pads 1012 and the second pads 1022 in a one-to-one correspondence after alignment.

It may be understood that, an alignment mark (not shown in the figure) is further disposed on each of the first to-be-spliced panel 1011 and the second to-be-spliced panel 1021. The alignment marks are grabbed for alignment, so that the first pads 1012 and the second pads 1022 correspond to each other one by one. Therefore, signal transmission disorder is prevented, and the signal transmission of the to-be-spliced panels is guaranteed.

13: Manufacturing conductive connecting portions 104 on the pad combinations P, wherein the conductive connecting portions 104 connect the first pads 1012 to the second pads 1022 in the pad combinations P.

Referring to FIG. 3c, FIG. 3c is a schematic diagram of manufacturing the conductive connecting portions 104 on the first pads 1012 and the second pads 1022. Since the conductive connecting portions 104 cover the corresponding first pads 1012 and second pads 1022, the first pads 1012 and the second pads 1022 are not shown in the figure.

In detail, the conductive connecting portions 104 are manufactured by inkjet printing. The details of inkjet printing have been recorded in the above, which are not described herein again.

14: Manufacturing a protective layer 105 on the conductive connecting portions 104, wherein the protective layer 105 completely covers the conductive connecting portions 104, the first pads 1012, and the second pads 1022.

Referring to FIG. 3d, FIG. 3d is a schematic diagram of the step of manufacturing the protective layer according to an embodiment of the present disclosure. Optionally, the manufacturing a protective layer 105 on the conductive connecting portions 104 includes the steps as follows:

141: Performing inkjet printing on the conductive connecting portions 104 with a protective layer material 105, to cause the protective layer to cover the conductive connecting portions 104, the first pads 1012, and the second pads 1022.

In detail, a size of an inkjet printing nozzle, a liquid spraying volume, and a liquid spraying path may be controlled, to cause the protective layer material to completely cover the conductive connecting portions 104.

Since the protective layer material is still manufactured by inkjet printing in the present embodiment of the present disclosure, devices used are simple, the process is simple, and the precision requirements for the devices can be reduced.

142: Curing the protective layer 105 material to form the protective layer 105.

Optionally, the protective layer 105 may be made of black ink, silicon resin doped with a carbon material, or epoxy resin doped with the carbon material. The protective layer 105 may cover the conductive connecting portions 104 to protect the conductive connecting portions 104. In addition, the protective layer 105 is made of a material having a relatively low reflectivity. Therefore, after the conductive connecting portions 104 are completely covered with the protective layer, the reflectivity at a seam between the first to-be-spliced panel 1011 and the second to-be-spliced panel 1021 can be reduced, thereby further visually narrowing the seam.

Optionally, a width of the protective layer 105 is between 30 microns and 80 microns, and a thickness of the protective layer 105 is between 4 microns and 8 microns. In detail, the width of the protective layer 105 may be 30 microns, 35 microns, 40 microns, 45 microns, 50 microns, 55 microns, 60 microns, 65 microns, 70 microns, 75 microns, or 80 microns. The thickness of the protective layer 105 may be 4 microns, 5 microns, 6 microns, 7 microns, or 8 microns. The width of the protective layer 105 may be adaptively designed according to widths of borders of the first to-be-spliced panel 1011 and the second to-be-spliced panel 1021.

Figure 4:
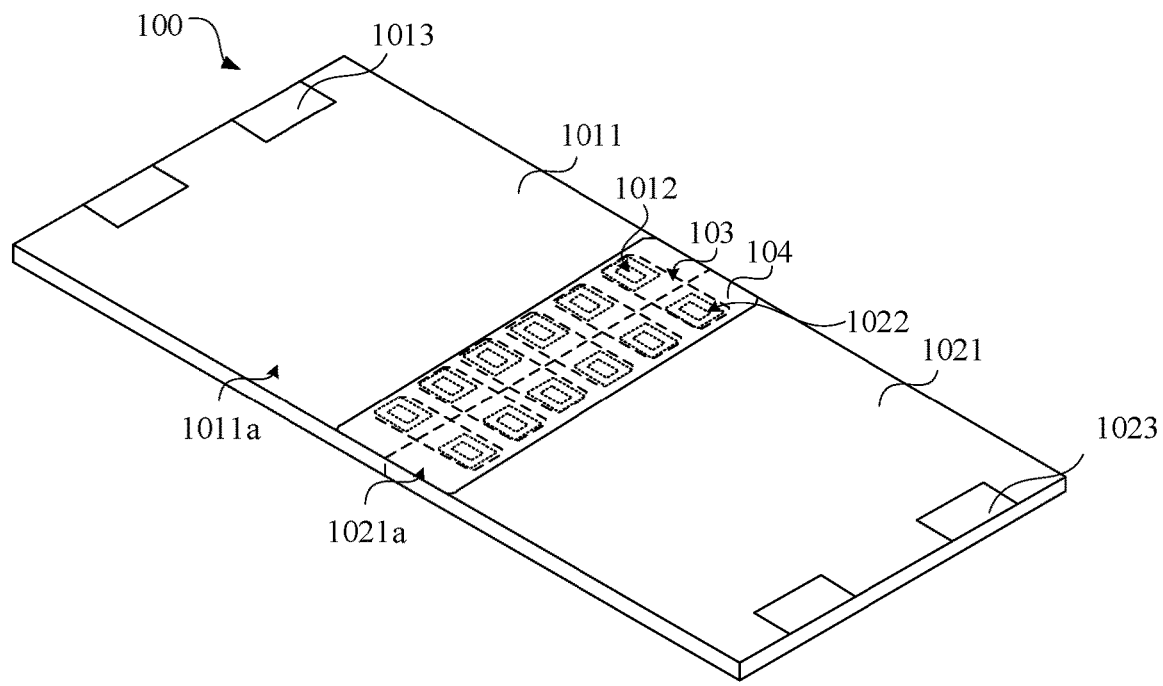
FIG. 4 is a schematic diagram of a first structure of a spliced display screen according to an embodiment of the present disclosure.

Correspondingly, referring to FIG. 4, FIG. 4 is a schematic diagram of a first structure of a spliced display screen according to an embodiment of the present disclosure. The embodiments of the present disclosure further provide a spliced display screen 100. The spliced display screen includes a first to-be-spliced panel 1011 and a second to-be-spliced panel 1021. A plurality of first pads 1012 are disposed on a side of the first to-be-spliced panel 1011 close to the second to-be-spliced panel 1021. A plurality of second pads 1022 are disposed on a side of the second to-be-spliced panel 1021 close to the first to-be-spliced panel 1011. A conductive connecting portion 104 is correspondingly disposed on each first pad 1012 and each second pad 1022. The first pads 1012 are correspondingly connected to the second pads 1022 in a one-to-one correspondence using the conductive connecting portions 104. The first to-be-spliced panel 1011 and the second to-be-spliced panel 1021 each have a display area 1011a and a splicing area 1021a. The first pads 1012 are disposed in the splicing area 1021a of the first to-be-spliced panel 1011. The second pads 1022 are disposed in the splicing area 1021a of the second to-be-spliced panel 1021.

Optionally, the spliced display screen 100 further includes a protective layer 105. The protective layer 105 is disposed on the conductive connecting portions 104. The protective layer 105 completely covers the conductive connecting portions 104, the first pads 1012, and the second pads 1022.

Optionally, the protective layer 105 may be made of black ink, silicon resin doped with a carbon material, or epoxy resin doped with the carbon material. The protective layer 105 may cover the conductive connecting portions 104 to protect the conductive connecting portions 104. In addition, the protective layer 105 is made of a material having a relatively low reflectivity. Therefore, after the conductive connecting portions 104 are completely covered with the protective layer, the reflectivity at a seam between the first to-be-spliced panel 1011 and the second to-be-spliced panel 1021 can be reduced, thereby further visually narrowing the seam.

Optionally, a width of the protective layer 105 is between 30 microns and 80 microns, and a thickness of the protective layer 105 is between 4 microns and 8 microns. In detail, the width of the protective layer 105 may be 30 microns, 35 microns, 40 microns, 45 microns, 50 microns, 55 microns, 60 microns, 65 microns, 70 microns, 75 microns, or 80 microns. The thickness of the protective layer 105 may be 4 microns, 5 microns, 6 microns, 7 microns, or 8 microns. The width of the protective layer 105 may be adaptively designed according to widths of borders of the first to-be-spliced panel 1011 and the second to-be-spliced panel 1021.

Optionally, each conductive connecting portions 104 is made of a metal material. Optionally, the conductive connecting portion 104 may be made of any of silver (Ag), aluminum (Al), nickel (Ni), chromium (Cr), molybdenum (Mo), copper (Cu), tungsten (W), or titanium (Ti). Metals, such as silver, aluminum, and copper have desirable conductivity and low costs. Therefore, not only the production cost can be reduced, but also the conductivity of the conductive connecting portion 104 is guaranteed. Optionally, the transverse signal and the longitudinal signal may be connected and transmitted using the silver line.

A thickness of the conductive connecting portion 104 is between 2 microns and 6 microns, and a width of the conductive connecting portion 104 is between 10 microns and 50 microns. In detail, the thickness of the conductive connecting portion 104 may be 2 microns, 3 microns, 4 microns, 5 microns, or 6 microns. The width of the conductive connecting portion 104 may be 10 microns, 15 microns, 20 microns, 25 microns, 30 microns, 35 microns, 40 microns, 45 microns, or 50 microns.

It may be understood that, a width of each of the first pads 1012 or each of the second pads 1022 is usually between 10 microns and 50 microns. In detail, the width of the first pad 1012 or the second pad 1022 may be 10 microns, 15 microns, 20 microns, 25 microns, 30 microns, 35 microns, 40 microns, 45 microns, or 50 microns.

Therefore, the width of the conductive connecting portion 104 may be designed corresponding to the width of the pad. In addition, the conductive connecting portion 104 is manufactured to have a certain thickness, to ensure more desirable conductivity of the conductive connecting portion 104. It is to be noted that, the width of the conductive connecting portion 104 may be greater than the widths of the first pad 1012 and the second pad 1022, as long as the adjacent conductive connecting portions 104 are avoided from a short circuit. Therefore, by reducing the on-resistance of the conductive connecting portion 104, signals of the first to-be-spliced panel 1011 and the second to-be-spliced panel 1021 can be transmitted more effectively.

Optionally, a COF 103 is further bound to the first to-be-spliced panel 1011 and/or the second to-be-spliced panel 1021. In detail, the COF 103 may be bound to a side of the first to-be-spliced panel 1011 away from the second to-be-spliced panel 1021. The COF 103 may be bound to a side of the second to-be-spliced panel 1021 away from the first to-be-spliced panel 1011.

Figure 5:
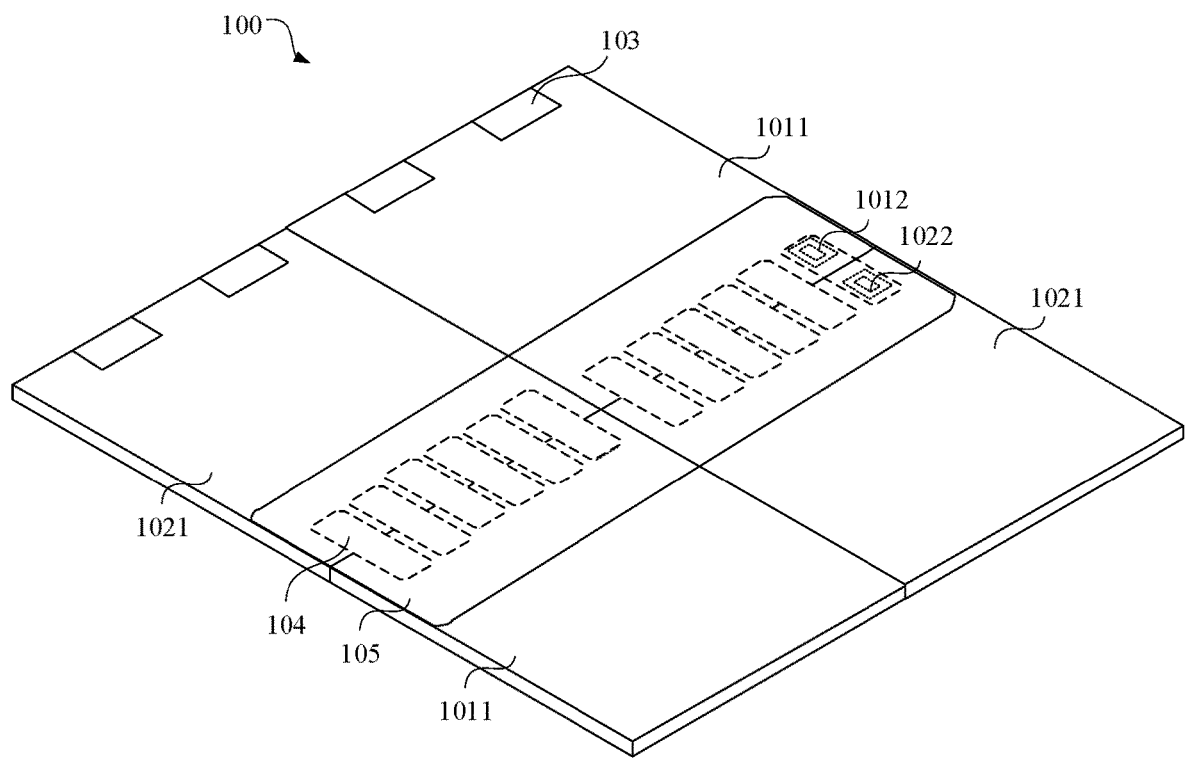
FIG. 5 is a schematic diagram of a second structure of the spliced display screen according to an embodiment of the present disclosure.

FIG. 4 is a schematic diagram of splicing two to-be-spliced panels. When more than two to-be-spliced panels are spliced, the COF is bound to at least an outermost to-be-spliced panel in each row. For example, the to-be-spliced panels are to be spliced in a 2×2 form. Referring to FIG. 5, FIG. 5 is a schematic diagram of a second structure of the spliced display screen according to an embodiment of the present disclosure. The first pads may be manufactured on two adjacent intersecting sides of the first to-be-spliced panel 1011 for splicing, for alignment and splicing with the second to-be-spliced panel 1021, and so is the second to-be-spliced panel 1021. In this case, the COF 103 is bound to a first to-be-spliced panel 1011 and a second to-be-spliced panel 1021 located outside.

Since the to-be-spliced panels in a same row have been connected using the conductive connecting portions 104, a signal outputted from the COF 103 bound to the outermost side can be transmitted to the adjacent to-be-spliced panel by using the conductive connecting portions 104. Therefore, the manufacturing of the COF on some to-be-spliced panels can be saved, thereby reducing the production cost and traces on the panels, and increasing the trace space.

Figure 6:
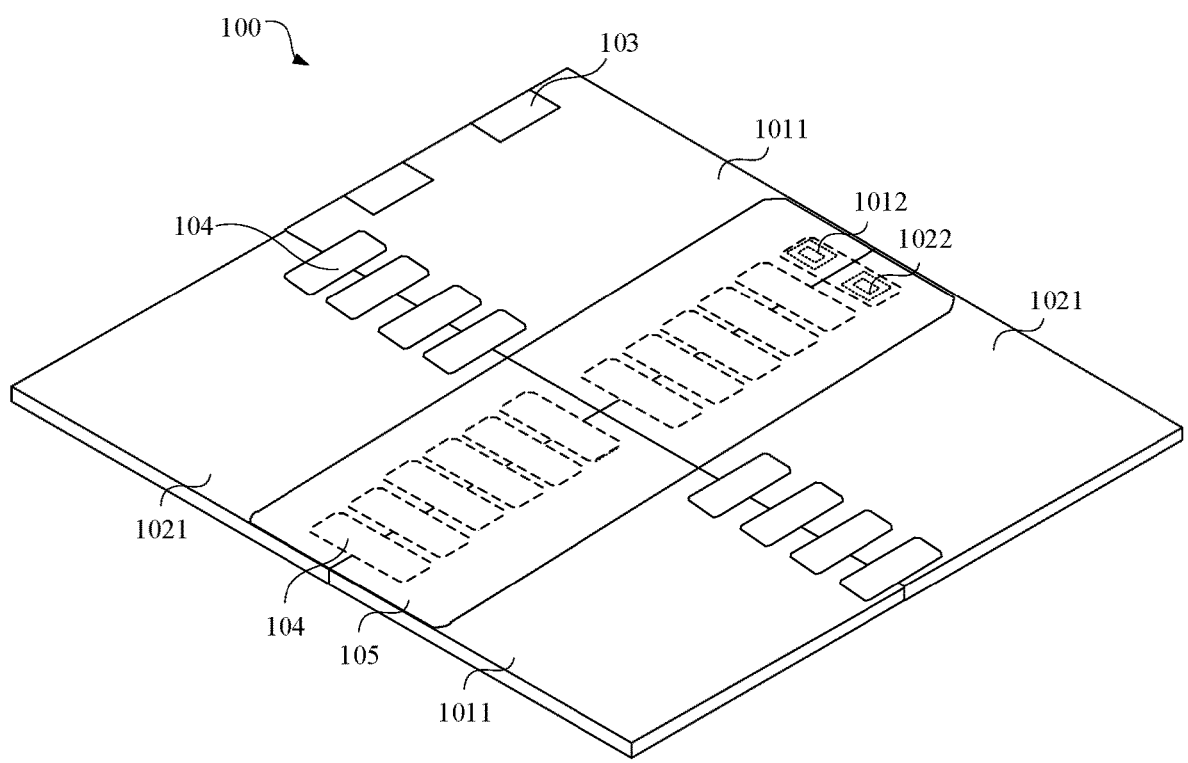
FIG. 6 is a schematic diagram of a third structure of the spliced display screen according to an embodiment of the present disclosure.

Optionally, referring to FIG. 6, FIG. 6 is a schematic diagram of a third structure of the spliced display screen according to an embodiment of the present disclosure. When one of the conductive connecting portions 104 connects the corresponding first pads 1012 to second pads 1022 in both intersecting directions, the COF 103 in a column direction can be further omitted. FIG. 6 shows first pads 1012 and second pads 1022 in only one direction and a protective layer 105 in only one direction. However, the structure shown in FIG. 6 is not construed as a limitation on the embodiments of the present disclosure.

It may be understood that, in order to ensure that the signal transmission is not affected by a voltage drop and an impedance loss of traces, in a large-size spliced display panel, the COF 103 may be further disposed on other to-be-spliced panels. A manner of disposing the COF 103 is not limited in the present disclosure, and the COF may be designed according to actual requirements for panels.

According to the spliced display screen 100 provided in the embodiments of the present disclosure, the conductive connecting portions 104 connecting the pads are designed to realize the connection between the pads in the splicing area 1021a. Therefore, the increase in costs caused by the limitation of side binding and back binding can be avoided. In addition, the conductive connecting portions 104 on the spliced display screen 100 provided in the embodiments of the present disclosure is manufactured by inkjet printing. Therefore, the requirements on process precision can be reduced, thereby further simplifying the process. The protective layer 105 is also manufactured by inkjet printing. In this way, the costs of other devices can be saved, thereby reducing the production costs.

A display screen splicing method and a spliced display screen provided in the embodiment of the present disclosure are described in detail above. The principles and implementations of the present disclosure are described through specific examples in this specification, and the descriptions of the embodiments are only intended to help understand the methods and core ideas of the present disclosure. Meanwhile, a person of skilled in the art may make modifications to the specific implementations and application scopes according to the ideas of the present disclosure. In conclusion, the content of the specification should not be construed as a limitation to the present disclosure.

What is claimed is:

1. A display screen splicing method, comprising:
providing a first to-be-spliced panel and a second to-be-spliced panel, wherein the first to-be-spliced panel comprises a first display area and a first border area, the first to-be-spliced panel comprises a plurality of first pads located in the first border area, the plurality of first pads are configured to transmit electric signals from the first to-be-spliced panel, the second to-be-spliced panel comprises a second display area and a second border area, the second to-be-spliced panel comprises a plurality of second pads located in the second border area, and the plurality of second pads are configured to transmit electric signals from the second to-be-spliced panel;
aligning the plurality of first pads to the plurality of second pads in a one-to-one correspondence to form a plurality of pad combinations, wherein the first border area is more adjacent to the second border area than the first display area, and a seam is formed between the first border area and the second border area; and
manufacturing a plurality of conductive connecting portions on the plurality of pad combinations, wherein one of the plurality of conductive connecting portions crosses the seam to connect a corresponding one of the plurality of first pads and a corresponding one of the plurality of second pads located on both sides of the seam.

2. The display screen splicing method as claimed in claim 1, wherein the manufacturing a plurality of conductive connecting portions on the plurality of pad combinations comprises:
performing inkjet printing on the plurality of pad combinations with conductive droplets, wherein the conductive droplets connect the plurality of first pads to the plurality of second pads in the plurality of pad combinations; and
curing the conductive droplets to form the plurality of conductive connecting portions.

3. The display screen splicing method as claimed in claim 2, wherein the curing comprises thermocuring or photocuring, and a duration of the curing is between 20 minutes and 40 minutes.

4. The display screen splicing method as claimed in claim 3, wherein a temperature of the thermocuring is between 80° C. and 150° C.

5. The display screen splicing method as claimed in claim 1, wherein the first to-be-spliced panel and the second to-be-spliced panel each have a display area and a splicing area disposed adjacent to each other, the plurality of first pads are disposed in the splicing area of the first to-be-spliced panel, and the plurality of second pads are disposed in the splicing area of the second to-be-spliced panel.

6. The display screen splicing method as claimed in claim 5, wherein after one of the plurality of conductive connecting portions is manufactured on each one of the plurality of first pads and the corresponding plurality of second pads, the method further comprises:

manufacturing a protective layer on the plurality of conductive connecting portions, wherein the protective layer completely covers the plurality of conductive connecting portions, the plurality of first pads, and the plurality of second pads.

7. The display screen splicing method as claimed in claim 6, wherein the manufacturing a protective layer on the plurality of conductive connecting portions comprises:
performing inkjet printing on the plurality of conductive connecting portions with a protective layer material, to cause the protective layer to cover the plurality of conductive connecting portions, the plurality of first pads, and the plurality of second pads; and
curing the protective layer material to form the protective layer.

8. The display screen splicing method as claimed in claim 6, wherein a width of the protective layer is between 30 microns and 80 microns, and a thickness of the protective layer is between 4 microns and 8 microns.

9. The display screen splicing method as claimed in claim 1, wherein a spacing between each one of the plurality of first pads and each one of the plurality of second pads is less than 100 microns.

10. The display screen splicing method as claimed in claim 1, wherein a width of each one of the plurality of first pads is between 10 microns and 50 microns, and a width of each one of the plurality of second pads is between 10 microns and 50 microns.

11. A spliced display screen, comprising a first to-be-spliced panel and a second to-be-spliced panel, wherein the first to-be-spliced panel comprises a plurality of first pads, and the second to-be-spliced panel comprises a plurality of second pads, wherein a plurality of conductive connecting portions are disposed on the plurality of first pads and the plurality of second pads;
wherein the first to-be-spliced panel comprises a first display area and a first border area, the plurality of first pads are located in the first border area and are configured to transmit electric signals from the first to-be-spliced panel; and
the second to-be-spliced panel comprises a second display area and a second border area, the plurality of second pads are located in the second border area and are configured to transmit electric signals from the second to-be-spliced panel, the first border area is more adjacent to the second border area than the first display area, and a seam is formed between the first border area and the second border area; and
one of the plurality of conductive connecting portions crosses the seam to connect a corresponding one of the plurality of first pads and a corresponding one of the plurality of second pads located on both sides of the seam.

12. The spliced display screen as claimed in claim 11, further comprising a protective layer, wherein the protective layer is disposed on the plurality of conductive connecting portions, and the protective layer completely covers the plurality of conductive connecting portions, the plurality of first pads, and the plurality of second pads.

13. The spliced display screen as claimed in claim 12, wherein a width of the protective layer is between 30 microns and 80 microns, and a thickness of the protective layer is between 4 microns and 8 microns.

14. The spliced display screen as claimed in claim 12, wherein the protective layer comprises black ink, silicon resin doped with a carbon material, or epoxy resin doped with the carbon material.

15. The spliced display screen as claimed in claim 11, wherein a chip on film (COF) is bound to the first to-be-spliced panel and/or the second to-be-spliced panel, wherein the COF is disposed on a side of the first to-be-spliced panel away from the second to-be-spliced panel, or the COF is disposed on a side of the second to-be-spliced panel away from the first to-be-spliced panel.

16. The spliced display screen as claimed in claim 11, wherein a spacing between the corresponding one of the plurality of first pads and the corresponding one of the plurality of second pads is less than 100 microns.

17. The spliced display screen as claimed in claim 11, wherein each one of the plurality of conductive connecting portions comprises one of silver, aluminum, nickel, chromium, molybdenum, copper, tungsten, or titanium.

18. The spliced display screen as claimed in claim 11, wherein a thickness of one of the plurality of conductive connecting portions is between 2 microns and 6 microns.

19. The spliced display screen as claimed in claim 11, wherein a width of the corresponding one of the plurality of first pads is between 10 microns and 50 microns, and a width of the corresponding one of the plurality of second pads is between 10 microns and 50 microns.

* * * * *